(12) United States Patent
Amiri

(10) Patent No.: US 12,185,639 B2
(45) Date of Patent: Dec. 31, 2024

(54) ANTIFERROMAGNETIC MEMORY DEVICE FEATURING TUNNELING MAGNETORESISTANCE READOUT AND CURRENT-INDUCED WRITING OF INFORMATION

(71) Applicant: Northwestern University, Evanston, IL (US)

(72) Inventor: Pedram Khalili Amiri, Wilmette, IL (US)

(73) Assignee: Northwestern University, Evanston, IL (US)

( * ) Notice: Subject to any disclaimer, the term of this patent is extended or adjusted under 35 U.S.C. 154(b) by 205 days.

(21) Appl. No.: 18/068,213

(22) Filed: Dec. 19, 2022

(65) Prior Publication Data

US 2023/0210015 A1     Jun. 29, 2023

Related U.S. Application Data

(60) Provisional application No. 63/293,354, filed on Dec. 23, 2021.

(51) Int. Cl.
*G11C 11/16*  (2006.01)
*H10N 50/01*  (2023.01)
(Continued)

(52) U.S. Cl.
CPC ........... *H10N 50/10* (2023.02); *G11C 11/161* (2013.01); *H10N 50/01* (2023.02); *H10N 50/85* (2023.02)

(58) Field of Classification Search
CPC ........ H10N 50/10; H10N 50/01; H10N 50/85; G11C 11/161; G11C 11/1673; G11C 11/1659; G11C 11/1675
(Continued)

(56) References Cited

U.S. PATENT DOCUMENTS

2010/0193889 A1*  8/2010  Nagahara .............. B82Y 10/00
                                                 257/E29.323
2018/0277184 A1*  9/2018  Zhao ..................... G11C 11/161
(Continued)

OTHER PUBLICATIONS

Lopez-Dominguez, Victor et al., "Picosecond Electric-Field-Induced Switching of Antiferromagnets," Physical Review Applied, vol. 11, No. 2, 024019, 2019, 6 pages.
(Continued)

*Primary Examiner* — Michael T Tran
(74) *Attorney, Agent, or Firm* — Benesch Friedlander Coplan & Aronoff LLP

(57) ABSTRACT

An antiferromagnetic (AFM) memory device includes a heavy metal (HM) layer having electrical terminals at two ends, and an AFM tunnel junction (ATJ) interfaced with the HM layer between the two ends. The ATJ includes an AFM material interfaced with a surface of the HM layer, a tunnel barrier layer including an oxide and interfaced with a top of the AFM layer, and a capping layer interfaced with a top of the tunnel barrier layer. The capping layer includes a heavy metal material or a ferromagnetic material. An electrode disposed on top of the capping layer facilitates reading information from the AFM memory device according to a magnetoresistance value measured between the electrode and one of the terminals of the HM layer. Information is written into the AFM memory device by passing current through the HM layer and below the AFM layer.

20 Claims, 4 Drawing Sheets

(51) Int. Cl.
  *H10N 50/10* (2023.01)
  *H10N 50/85* (2023.01)
(58) Field of Classification Search
  USPC .................................................. 365/158, 168
  See application file for complete search history.

(56) References Cited

U.S. PATENT DOCUMENTS

| | | | |
|---|---|---|---|
| 2019/0165254 A1* | 5/2019 | Lee ........................ | H10N 50/80 |
| 2019/0305212 A1* | 10/2019 | Gosavi .................... | G11C 11/18 |
| 2019/0325931 A1* | 10/2019 | Victora ................... | G11C 11/161 |
| 2019/0386202 A1* | 12/2019 | Gosavi .................... | H10N 50/01 |
| 2021/0074344 A1* | 3/2021 | Hu .......................... | G11C 11/161 |
| 2021/0098040 A1* | 4/2021 | Shiokawa ............... | H01L 29/82 |
| 2022/0006006 A1* | 1/2022 | Komura .................. | H10N 50/85 |
| 2022/0115440 A1* | 4/2022 | Saito ....................... | H01F 10/329 |
| 2022/0310146 A1* | 9/2022 | Xing ....................... | G11C 11/1675 |
| 2023/0028652 A1* | 1/2023 | Saito ....................... | H10N 50/10 |
| 2024/0244983 A1* | 7/2024 | Saito ....................... | H01F 10/32 |

OTHER PUBLICATIONS

Shi, Jiacheng et al., "Electrical Manipulation of the Magnetic Order in Antiferromagnetic PtMn Pillars," Nature Electronics, vol. 3, No. 2, 2020, 7 pages.

Arpaci, Sevdenur et al, "Observation of Current-Induced Switching in Non-Collinear Antiferromagnetic IrMn3 by Differential Voltage Measurements," Nature Communications, vol. 12, No. 1, 2021, 10 pages.

Park, B.G. et al., "A Spin-valve-like Magnetoresistance of an Antiferromagnet-Based Tunnel Junction," Nature Materials, vol. 10, No. 5, 2011, 5 pages.

Shick, A.B. et al., "Spin-Orbit Coupling Induced Anisotropy Effects in Bimetallic Antiferromagnets: A Route Towards Antiferromagnetic Spintronics," Physical Review B, vol. 81, No. 21, 212409, 2010, 4 pages.

Jungwirth, T. et al., "Demonstration of Molecular Beam Epitaxy and a Semiconducting Band Structure for I—Mn—V Compounds," Physical Review B, vol. 83, No. 3, p. 035321, 2011, 6 pages.

\* cited by examiner

ANTIFERROMAGNETIC MEMORY DEVICE FEATURING TUNNELING MAGNETORESISTANCE READOUT AND CURRENT-INDUCED WRITING OF INFORMATION

CROSS REFERENCE TO RELATED APPLICATIONS

The present application claims the benefit of priority under 35 U.S.C. § 119 from U.S. Provisional Patent Application Ser. No. 63/293,354, entitled "Antiferromagnetic Memory Device Featuring Tunneling Magnetoresistance Readout and Current-Induced Writing of Information," filed on Dec. 23, 2021, all of which is incorporated herein by reference in its entirety for all purposes.

TECHNICAL FIELD

The present disclosure generally relates to antiferromagnetic memory devices, and more specifically relates to antiferromagnetic memory devices featuring tunneling magnetoresistance readout and current-induced writing of information.

BACKGROUND

Magnetic memory devices feature materials that have magnetic properties useful for memory storage. Ferromagnetic (FM) materials, for example, exhibit magnetization at the atomic level, even in the absence of an external magnetic field. Magnetic memory devices may utilize the FM materials' property that the polarity of their atoms' magnetization may change in an electric field.

Antiferromagnetic (AFM) materials are magnetically ordered materials without a net macroscopic magnetization. They have two or more magnetic sublattices, coupled through exchange interaction, whose magnetizations cancel out. The cancelation of AFM materials' magnetizations may be represented mathematically as $\Sigma_{i=1}^{N}\vec{N}_i=0$. AFM materials may be useful for computer memory devices.

Magnetic random access memory (MRAM) is gaining interest and traction in the semiconductor industry as a replacement for relatively slow embedded flash memory. For example, MRAM based on existing spin-transfer torque technology (STT-MRAM) is being manufactured by several foundries to replace relatively slow embedded flash in manufacturing nodes, for example, below 28 nm.

SUMMARY

In one example, an antiferromagnetic (AFM) tunnel junction (AJT) may include a circular AFM layer, the AFM layer having an AFM material having at least two coupled magnetic sub-lattices. The ATJ may also include a circular tunnel barrier layer disposed on top of and interfaced with the AFM layer, the tunnel barrier layer having a metal oxide material. The ATJ may furthermore include a circular capping layer disposed on top of and interfaced with the tunnel barrier layer, the capping layer having a capping material of a heavy metal or a ferromagnetic material. The ATJ may in addition include where the circular AFM layer, tunnel barrier layer, and capping layer are arranged in a pillar and electrically conductive to pass an electrical current through the pillar.

Examples may include one or more of the following features. An ATJ device where the AFM layer may include an AFM material of PtMn. An ATJ device where the AFM layer may include an AFM material of PtMn3. An ATJ device where the AFM layer may include an AFM material of IrMn3. An ATJ device where the AFM layer may include an AFM material of SnMn3. An ATJ device where the AFM layer may include an AFM material of Pd2Mn. An ATJ device where the capping layer may include a heavy metal Pt. An ATJ device where the capping layer may include a heavy metal Ta. An ATJ device where the capping layer may include a fixed ferromagnetic material CoFe. An ATJ device where the capping layer may include a fixed ferromagnetic material CoFeB.

In one example, an antiferromagnetic (AFM) memory device may include a heavy metal (HM) layer having a first electrical terminal at a first end and a second electrical terminal at a second end, the HM layer having a heavy metal and being electrically conductive to pass an electrical current between the first electrical terminal and the second electrical terminal. The AFM memory device may also include an AFM layer disposed on top of and interfaced with the HM layer, the AFM layer having an AFM material having at least two coupled magnetic sub-lattices. The AFM memory device may furthermore include a tunnel barrier layer disposed on top of and interfaced with the AFM layer, the tunnel barrier layer having a metal oxide material. The AFM layer may in addition include a capping layer disposed on top of and interfaced with the tunnel barrier layer, the capping layer having a capping material of a heavy metal or a ferromagnetic material. The AFM memory device may moreover include an electrode disposed on top of and in electrical communication with the capping layer, the electrode having an electrically conductive material.

Examples may include one or more of the following features. An AFM memory device where the AFM layer may include an AFM material PtMn. An AFM memory device where the AFM layer may include an AFM material PtMn3. An AFM memory device where the AFM layer may include an AFM material of IrMn3. An AFM memory device where the AFM layer may include an AFM material of SnMn3. An AFM memory device where the AFM layer may include an AFM material of Pd2Mn. An AFM memory device where the capping layer may include a heavy metal Pt. An AFM memory device where the capping layer may include a heavy metal Ta. An AFM memory device where the capping layer may include a fixed ferromagnetic material CoFe. An AFM memory device where the capping layer may include a fixed ferromagnetic material CoFeB. An AFM memory device where the AFM layer, the tunnel barrier layer, the capping layer, and electrode are arranged in a circular pillar having a diameter of about or less than 50 nm. An AFM memory device where the AFM layer has a thickness within a range between about 7 nm and 20 nm. An AFM memory device may include a plurality of AFM memory devices and electronic circuitry coupled with the plurality of AFM memory devices and the AFM memory device and configured as a complementary metal oxide semiconductor (CMOS)-compatible magnetic random-access memory (MRAM). The MRAM may include electronic circuitry to address, select, write to, and read from a specifically addressed one or more of the AFM memory devices included in the MRAM.

In one example, a method of fabricating an AFM memory device may include forming a heavy metal (HM) layer having a first electrical terminal at a first end and a second electrical terminal at a second end, the HM layer having a heavy metal and being electrically conductive to pass an electrical current between the first electrical terminal and the second electrical terminal. The method may also include forming a plurality of layers in a perpendicularly rising sequence above the HM layer, the plurality of layers having an antiferromagnetic (AFM) layer including an AFM material and interfaced with the HM layer, a tunnel barrier layer including a metal oxide material and interfaced with the AFM layer, a capping layer including a capping material of a non-magnetic metal or a ferromagnetic material, and an electrode interfaced with the capping layer. The method may furthermore include performing thermal annealing. The method may in addition include patterning the plurality of layers into a circular pillar. Other examples include corresponding computer systems, apparatuses, and computer programs recorded on one or more computer storage devices, each configured to perform the actions of the methods.

Examples may include one or more of the following features. A method where the AFM layer is formed including an AFM material of PtMn. A method where the AFM layer is formed including an AFM material of PtMn3. A method where the AFM layer is formed including an AFM material of IrMn3. A method where the AFM layer is formed including an AFM material of SnMn3. A method where the AFM layer is formed including an AFM material of Pd2Mn. A method where the capping layer is formed including a heavy metal Pt. A method where the capping layer is formed including a heavy metal Ta. A method where the capping layer is formed including a fixed ferromagnetic material CoFe. A method where the capping layer is formed including a fixed ferromagnetic material CoFeB. A method where the AFM layer is formed with a thickness within a range between about 7 nm and 20 nm. A method where the circular pillar is patterned with a diameter within a range of about 30 nm to about 50 nm. A method where the circular pillar is patterned with a diameter within a range of about 50 nm to about 70 nm. A method where forming the plurality of layers may include sputter depositing using physical vapor deposition. A method where the circular pillar is patterned using electron beam lithography. In certain aspects, a method where the circular pillar is patterned using deep or extreme ultra-violet lithography. A method where the tunnel barrier layer is deposited by radio-frequency (RF) sputtering. A method where layers having metallic compounds are deposited by DC sputtering. Examples of the described techniques may include hardware, a method or process, or a computer tangible medium.

A system of one or more computers may be configured to perform particular operations or actions by virtue of having software, firmware, hardware, or a combination thereof installed on the system that in operation causes or cause the system to perform the actions. One or more computer programs may be configured to perform particular operations or actions by virtue of including instructions that, when executed by a computing processor or data processing apparatus, cause the computing processor or apparatus to perform the actions.

BRIEF DESCRIPTION OF DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

Figure 1:
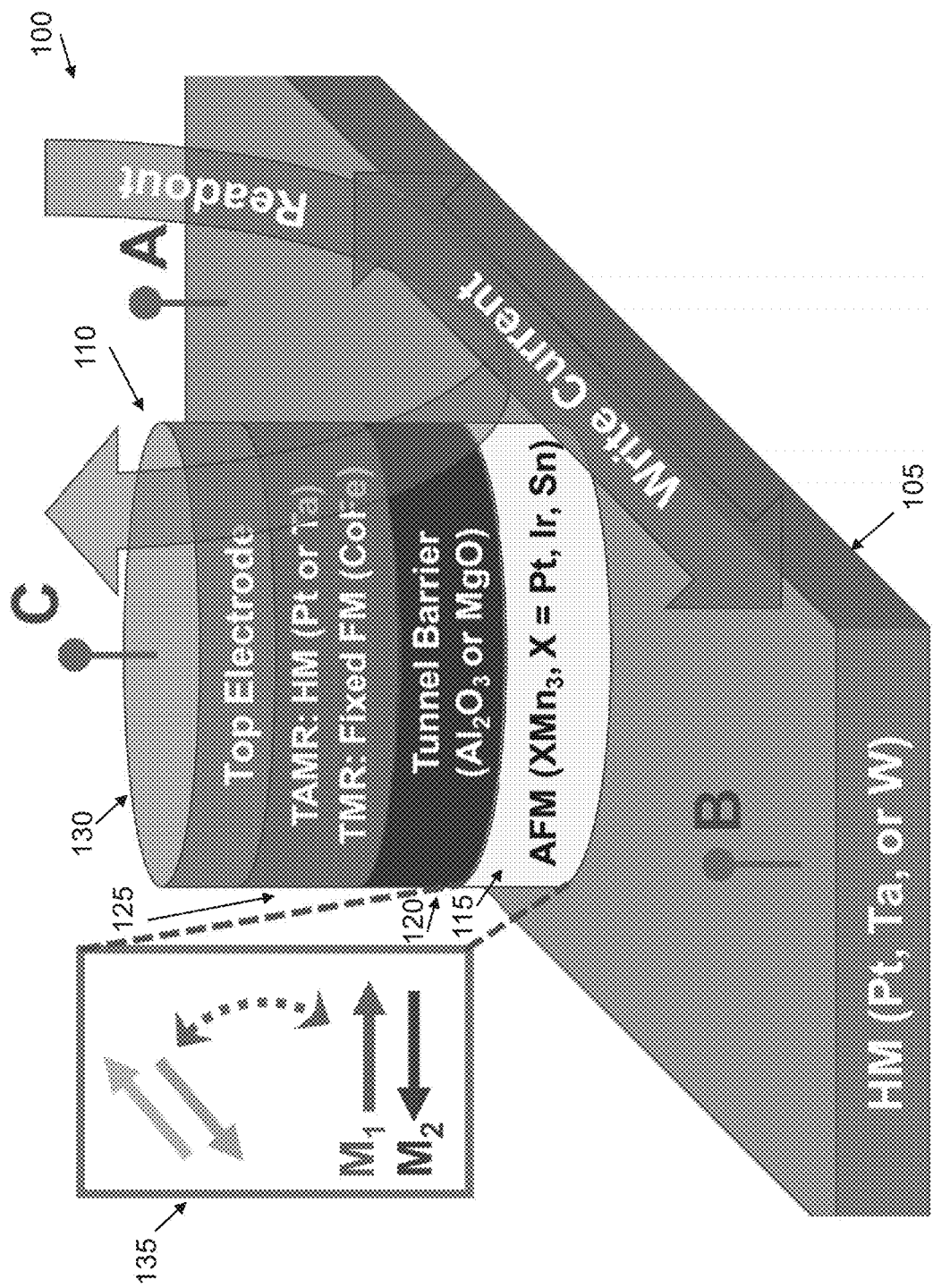
FIG. 1 is a schematic diagram that illustrates an exemplary three-terminal antiferromagnetic (AFM) spin-orbit torque (SOT) magnetic random access memory (MRAM) (AFM-SOT-MRAM) device featuring a SOT-based write mechanism and a tunneling anisotropic magnetoresistance (TAMR)/tunneling magnetoresistance (TMR) (TAMR/TMR)-based readout mechanism.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Several characteristics of AFM materials make them uniquely promising for ultrahigh-density, ultrafast, and low-power spintronic memory devices. First, there may be no bit-to-bit dipole interaction between AFM bits, facilitating placement of adjacent AFM bits closer together than with ferromagnetic (FM) devices, thus achieving higher bit density. Second, devices based on AFM materials may have ultrafast write times in the picoseconds range, due to AFM materials' fast exchange-dominated dynamics. Third, memory devices based on AFM materials may be immune to tampering by magnetic fields. This makes them more secure and potentially less expensive than FM-based devices, since the AFM-based devices may not require magnetic shielding, in contrast to some of the existing magnetic memory products.

These characteristics of AFM materials may facilitate applications of magnetic random-access memory (MRAM) based on AFM materials beyond the limited application areas of existing spin-transfer torque technology (STT-MRAM). In particular, AFM-based devices may enable MRAM to scale to advanced silicon manufacturing nodes (e.g., <10 nm feature sizes) and achieve speeds comparable to static random-access memory (SRAM). Achieving high speed operation makes memory devices suitable for high data throughput applications, for example, applications in artificial intelligence (AI) and high-performance computing (HPC).

Described herein are novel three-terminal antiferromagnetic (AFM) memory devices with full electrical read and write capability. These AFM memory devices described herein are based on silicon-compatible sputter-deposited AFM materials. Information may be encoded in these AFM memory devices using the direction of the Neel vector (e.g., $\vec{L}=\vec{M}_1-\vec{M}_2$) as the state variable. Writing of information may be accomplished through a combination of interfacial and bulk spin-orbit torque (SOT), by passing in-plane electric current through a heavy metal layer, on top of which the nanoscale AFM memory bit is placed. Reading of information may be accomplished using tunneling anisotropic magnetoresistance (TAMR) and tunneling magnetoresistance (TMR) effects, thereby providing a large room-temperature on/off ratio. This separation of read and write paths facilitates advantages of higher cycling endurance and separate optimization of material parameters for the read and write steps.

FIG. 1 is a schematic diagram that illustrates an exemplary three-terminal AFM-SOT-MRAM device 100 featuring a SOT-based write mechanism and a TAMR/TMR-based readout mechanism. A heavy metal (HM) layer 105 may be formed at a bottom of the device 100. The HM layer 105 may include a first electrical terminal A at a first end and a second electrical terminal B at a second end. The HM layer 105 may be electrically conductive to pass an electrical current between the first electrical terminal A and the second electrical terminal B. The HM layer 105 may include one or more heavy metals with large spin-orbit coupling, for example, Pt, Ta, or W.

A nanoscale antiferromagnetic tunnel junction (ATJ) 110 may be integrated on the heavy metal (HM) layer 105. The ATJ 110 may include an AFM layer 115 disposed on top of the HM layer 105. The AFM layer 115 may include an antiferromagnetic material including an $XMn_3$ compound, where X may be one of the elements Pt, Ir, Sn, or other options. Another option for an antiferromagnetic material to include in the AFM layer 115 may be $Pd_2Mn$, for example. The example materials to include in the AFM layer 115 listed here should not be construed as limiting, but merely examples. Other compositions and stoichiometries of each pair of materials listed herein may be utilized in various examples. The AFM layer 115 may store a data bit written to the MRAM device 100 by current passed between the terminals A and B through the HM layer 105 below the AFM layer 115.

A tunnel barrier layer 120 may be disposed on top of and interface with the AFM layer 115. The tunnel barrier layer 120 may include an oxide material, for example, $Al_2O_3$ or MgO. The tunnel barrier layer 120 may be capped with a capping layer 125 disposed on top of the tunnel barrier layer 120. In examples where the MRAM device 100 is configured to perform reading using TAMR effects, the capping layer 125 may include a non-magnetic (NM) metal (e.g., Pt or Ta). In examples where the MRAM device 100 is configured to perform reading using TMR effects, the capping layer 125 may include a fixed ferromagnetic material (FM) to form a fixed ferromagnetic reference layer, for example, CoFe. A top electrode 130 including a third electrical terminal C may be disposed on top of the capping layer 125.

Inset 135 illustrates that the AFM layer 115 includes a plurality of different magnetic sub-lattices $M_x$, with the magnetization of each sub-lattice opposite that of the adjacent sub-lattice. Note that while only two magnetic sub-lattices ($M_1$, $M_2$) are shown in the inset 135 for simplicity, in other examples of the technology described herein, other quantities of sub-lattices may be included in the AFM layer 115. For example, the AFM layer 115 may be a non-collinear AFM having three sub-lattices.

The ATJ 110 may be fabricated on top of the HM layer 105 using a silicon-compatible sputter-deposition process. The layers (e.g., 115, 120, 125) of the ATJ 110 may be fabricated using a physical vapor deposition (PVD) apparatus. The ATJ 110 may be patterned into a circular pillar with a specified diameter (e.g., about or less than 50 nm) using a lithography process, for example, by using an electron beam lithography apparatus.

Writing a data bit to be stored in the MRAM device may be performed by passing in-plane electric current through the HM layer 105 between the electrical terminals A and B. Readout of a data bit from the MRAM device 100 may be performed by measuring tunneling resistance through the ATJ 110 via an electrical connection between the terminals C and A/B. Thus, the writing process may use a separate pair of terminals than the reading process. By virtue of the reading and writing processes using separate pairs of terminals, the MRAM device 100 features a 3-terminal device structure.

The writing process may be performed through a combination of interfacial and bulk SOT. Passing in-plane current through the HM layer 105 between the electrical terminals A and B may generate interfacial SOT due to the spin Hall effect of the HM layer 105 and Rashba effect of the interface between the HM layer 105 and AFM layer 115. In addition, due to the high conductivity of the metallic AFM bits (in the AFM layer 115), a sizeable bulk SOT may originate within the AFM layer 115. This bulk SOT contribution may significantly increase the switching efficiency of the MRAM device 100, particularly for thicker AFM films (e.g., exemplary AFM layers 115), as shown in our previous work for the case of micrometer-scale PtMn bits. The bulk SOT may also indirectly help to realize a larger readout signal (e.g., a larger on/off ratio), since the TAMR and TMR ratios may increase with larger thicknesses of the AFM layer 115.

The ATJ 110 may provide readout functionality of the state of the MRAM device 100, corresponding to the data bit stored in the MRAM device 100, via the TAMR or TMR effects. In particular, readout of the data stored in the MRAM device 100 may be performed by measuring the tunneling resistance through the ATJ 110, which may exhibit a large room-temperature magnetoresistance through one of the following mechanisms: 1) tunneling anisotropic magnetoresistance (TAMR) in AFM/oxide/NM tunnel junctions; or 2) tunneling magnetoresistance (TMR) in AFM/oxide/FM tunnel junctions. Each of these mechanisms in examples of the ATJ 110 are described below.

The TAMR effect in AFM/oxide/NM tunnel junctions may be utilized by an example of the ATJ 110 when the capping layer 125 includes a nonmagnetic (NM) metal, e.g., Pt or Ta. The TAMR effect may translate the orientation of the Neel vector within the AFM layer 115 into a change of the tunneling resistance measured across the ATJ 110. The TAMR effect has been shown to translate the orientation of the Neel vector within AFM bits of other exemplary ATJs comprising an $IrMn_3/Al_2O_3$/Pt structure, where the $IrMn_3$ was exchange coupled to an adjacent NiFe film. In experimental measurements of such a device, the modification of the average Neel vector in $IrMn_3$ was achieved through the exchange spring effect, i.e., by applying a magnetic field to the device to turn the magnetic moment of NiFe, which in turn reorientated the spins in the antiferromagnetic $IrMn_3$ layer. A challenge with this experiment with the exemplary ATJ comprising an $IrMn_3/Al_2O_3$/Pt structure, however, was that this magnetic-field-controlled reorientation of the Néel vector necessitated the use of ultrathin IrMn3 films (e.g., 1.5 nm and 3 nm thick), which prevented the observation of TAMR at room temperature due to their low Neel temperature. However, at 4 K, a TAMR ratio as high as 160% was reported, dropping to 4% at 100 K.

In contrast to the prior work with the exemplary ATJ comprising an $IrMn_3/Al_2O_3/Pt$ structure, an operating temperature of the exemplary ATJ 110 devices described herein may be pushed to room temperature by using SOT to control their Néel vector, instead of the above-mentioned exchange spring effect. The AFM order in PtMn and IrMn3 layers as thick as 10 nm may be successfully electrically controlled, and such materials at that thickness have Neel temperatures well above room temperature. In the examples of the MRAM device 100 according to the technology described herein, using these thicker AFM films (e.g., having thicknesses from about 7 to 20 nm) may facilitate observation of sizeable room-temperature TAMR in experimental measurements.

Figure 2A:
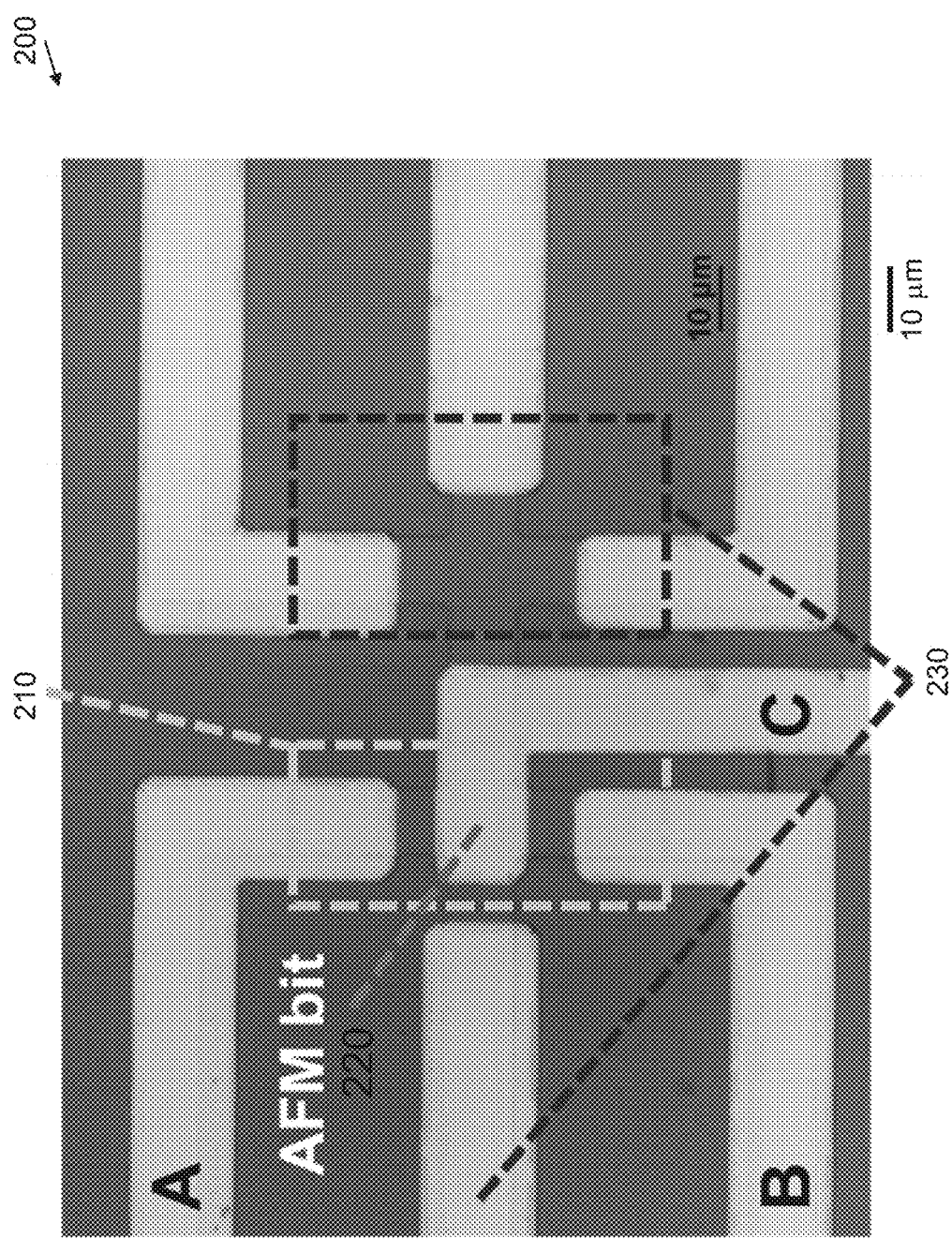
FIG. 2A is an image of an exemplary experimental MRAM prototype including a fully functional AFM-based SOT-MRAM device and an AFM bit.

FIG. 2A is an image of an exemplary experimental MRAM prototype 200 including a fully functional AFM-based SOT-MRAM device 210 and an AFM bit 220. The SOT-MRAM device 210 was fabricated using silicon-compatible metallic AFM layers corresponding to the MRAM device 100 illustrated in FIG. 1. In this experimental example SOT-MRAM device 210, the AFM layer uses $PtMn_3$ material. The device structure of the MRAM prototype 200 includes a 6-terminal double-cross Pt layout with an AFM pillar (e.g., AFM bit 220) patterned on only one cross, which facilitates differential readout. On top of this AFM pillar, a complete ATJ structure comprising an AFM/oxide/NM stack has been integrated. The ATJ structure is patterned into an 8 μm diameter disk, where the Néel vector may be rotated by SOT and read out via the TAMR effect. The SOT-MRAM device 210 includes electrical terminals A, B, and C. The AFM bit 220 may include a micrometer-scale ATJ (e.g., an example of the ATJ 110) disposed beneath an electrical contact to terminal C for readout via TAMR. Writing data to the AFM bit 220 may be performed by passing current along electrical terminals A and B. The exemplary MRAM prototype 200 includes additional terminals 230 for control experiments and differential voltage readouts.

Figure 2B:
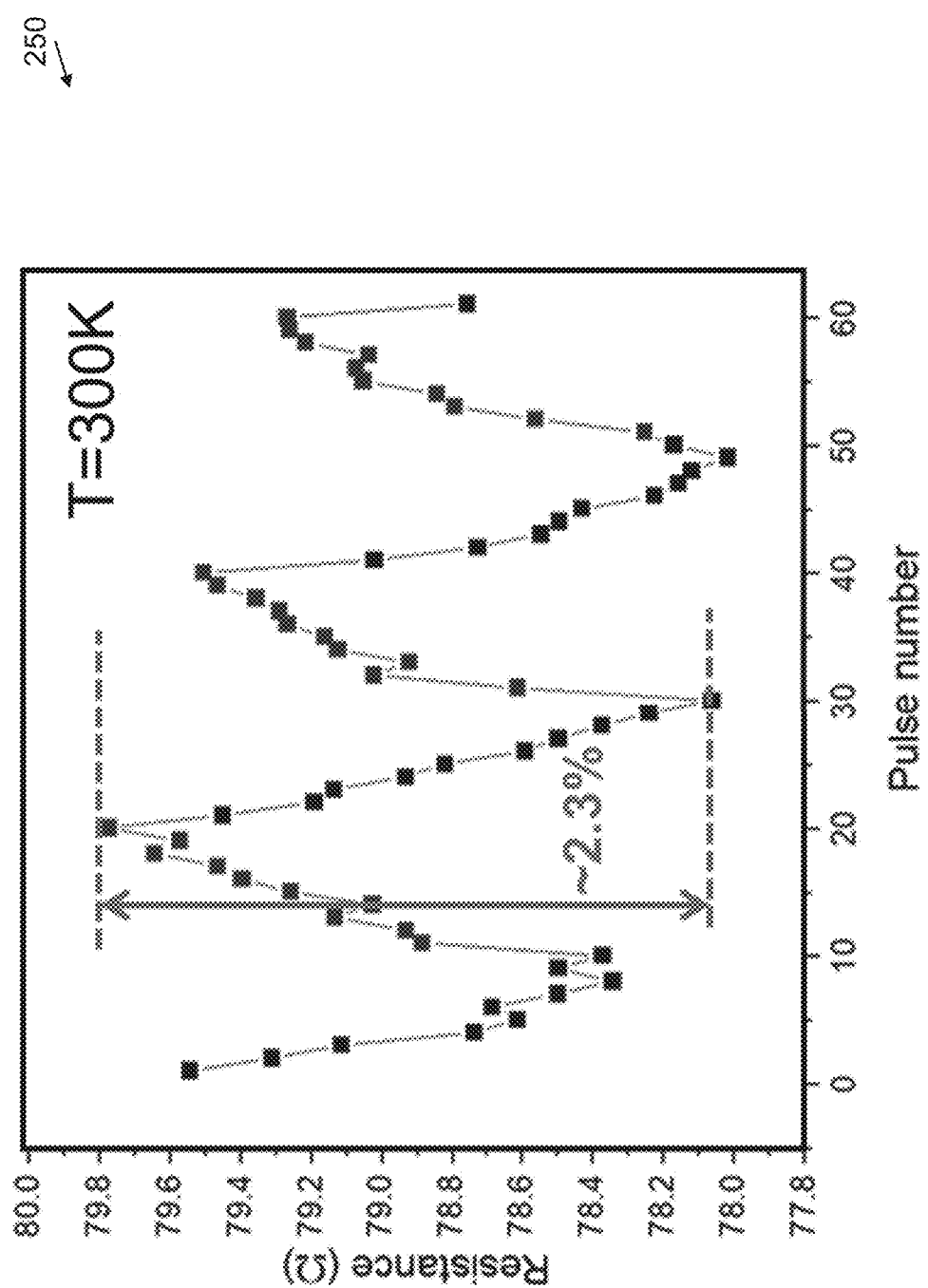
FIG. 2B is an exemplary graph that illustrates experimental results of the exemplary experimental MRAM prototype.

FIG. 2B is an exemplary graph 250 that illustrates experimental results of the exemplary experimental MRAM prototype 200. Graph 250 illustrates a plot of data points showing measured resistance vs. pulse number at room temperature (T=300K). In a measurement of the first room-temperature TAMR in an SOT-controlled ATJ device, as shown in graph 250, a TAMR signal of about 2.3% is observed at room temperature, reading out the state of the AFM bit 220 which was switched by SOT.

Tunneling magnetoresistance (TMR) in AFM/oxide/FM tunnel junctions may be used to realize electrical readout in AFM-SOT-MRAM devices (e.g., the MRAM device 100) based on an ATJ structure (e.g., the ATJ 110) that includes a fixed ferromagnetic (FM) layer (e.g., capping layer 125), the magnetization of which may provide a reference direction for the AFM-SOT-MRAM device. The operation of this exemplary TMR-based ATJ 100 may therefore be similar to a conventional ferromagnetic tunnel junction (FeMTJ), with one of the FM layers replaced by an antiferromagnetic (AFM) material. The state variable in this exemplary TMR-based ATJ 100 device is the Néel vector of the AFM layer. Hence, the readout may depend on the realization of a large room-temperature change of the device resistance as a function of the relative orientation of the AFM Néel vector and the reference FM magnetization vector.

Figure 3:
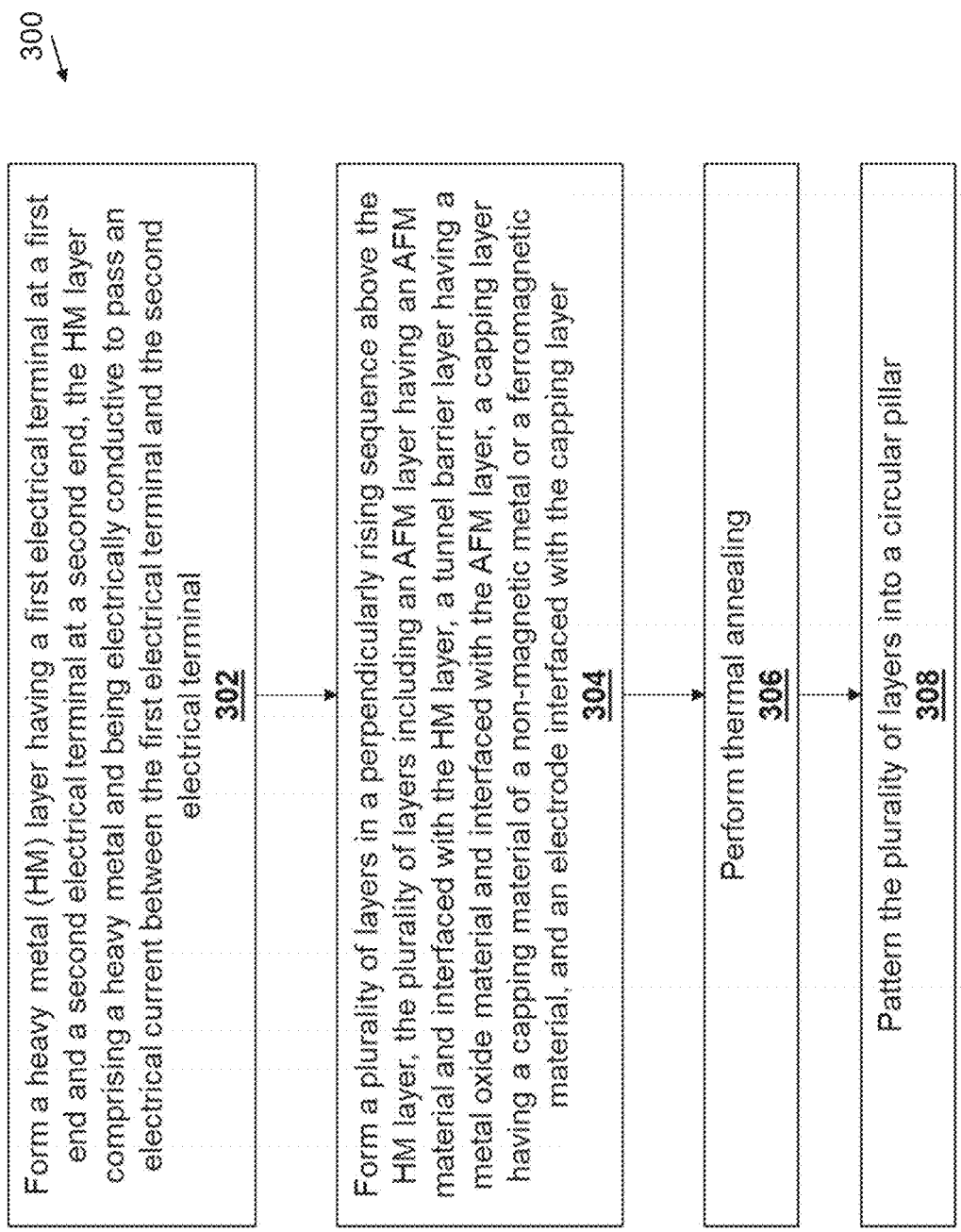
FIG. 3 is a flowchart that illustrates an exemplary process 300 of fabricating an antiferromagnetic (AFM) memory device.

FIG. 3 is a flowchart that illustrates an exemplary process 300 of fabricating an antiferromagnetic (AFM) memory device. In some examples, one or more process blocks of FIG. 3 may be performed by semiconductor fabrication equipment, for example, a physical vapor deposition (PVD) apparatus, a heating device, and/or an electron beam lithography apparatus.

As shown in FIG. 3, process 300 may include forming a heavy metal (HM) layer having a first electrical terminal at a first end and a second electrical terminal at a second end, the HM layer having a heavy metal and being electrically conductive to pass an electrical current between the first electrical terminal and the second electrical terminal (block 302). For example, semiconductor fabrication equipment may form a heavy metal (HM) layer having a first electrical terminal at a first end and a second electrical terminal at a second end, the HM layer having a heavy metal and being electrically conductive to pass an electrical current between the first electrical terminal and the second electrical terminal, as described above.

As also shown in FIG. 3, process 300 may include forming a plurality of layers in a perpendicularly rising sequence above the HM layer, the plurality of layers having an AFM layer including an AFM material and interfaced with the HM layer, a tunnel barrier layer including a metal oxide material and interfaced with the AFM layer, a capping layer including a capping material selected from either a non-magnetic metal or a ferromagnetic material, and an electrode interfaced with the capping layer (block 304). For example, semiconductor fabrication equipment may form a plurality of layers in a perpendicularly rising sequence above the HM layer, the plurality of layers having an AFM layer including an AFM material and interfaced with the HM layer, a tunnel barrier layer including a metal oxide material and interfaced with the AFM layer, a capping layer including a capping material selected from either a non-magnetic metal and a ferromagnetic material, and an electrode interfaced with the capping layer, as described above.

As further shown in FIG. 3, process 300 may include performing thermal annealing (block 306). For example, semiconductor fabrication equipment may perform thermal annealing, as described above. As also shown in FIG. 3, process 300 may include patterning the plurality of layers into a circular pillar (block 308). For example, semiconductor fabrication equipment may pattern the plurality of layers into a circular pillar, as described above.

Process 300 may include additional examples, such as any single example or any combination of examples described below and/or in connection with one or more other processes described elsewhere herein. In a first example, the AFM layer is formed including two magnetic sub-lattices.

In a second example, alone or in combination with the first example, the AFM layer is formed with a thickness within a range between about 7 nm and 20 nm.

In a third example, alone or in combination with the first and second example, the circular pillar is patterned with a diameter within a range of about 30 nm to about 50 nm.

In a fourth example, alone or in combination with one or more of the first through third examples, the circular pillar is patterned with a diameter within a range of about 50 nm to about 70 nm.

In a fifth example, alone or in combination with one or more of the first through fourth examples, forming the plurality of layers may include sputter depositing using physical vapor deposition.

In a sixth example, alone or in combination with one or more of the first through fifth examples, the circular pillar is patterned using electron beam lithography.

In a seventh example, alone or in combination with one or more of the first through sixth examples, the tunnel barrier layer is deposited by radio-frequency (RF) sputtering.

In an eighth example, alone or in combination with one or more of the first through seventh examples, layers having metallic compounds are deposited by DC sputtering.

In a ninth example, alone or in combination with one or more of the first through eighth example, the HM layer includes a heavy metal Pt.

In a tenth example, alone or in combination with one or more of the first through ninth example, the HM layer includes a heavy metal Ta.

In an eleventh example, alone or in combination with one or more of the first through tenth example, the HM layer includes a heavy metal W.

In a twelfth example, alone or in combination with one or more of the first through eleventh example, the AFM layer includes an AFM material $PtMn_3$.

In a Thirteenth Example, Alone or in Combination with One or More of the First Through Twelfth Example, the AFM Layer Includes an AFM Material $IrMn_3$.

In a fourteenth example, alone or in combination with one or more of the first through thirteenth example, the AFM layer includes an AFM material $SnMn_3$.

In a fifteenth example, alone or in combination with one or more of the first through fourteenth example, the AFM layer includes an AFM material $Pd_2Mn$.

In a sixteenth example, alone or in combination with one or more of the first through fifteenth example, the AFM layer is formed as a non-collinear AFM with three magnetic sub-lattices.

In a seventeenth example, alone or in combination with one or more of the first through sixteenth example, the capping layer is formed to include a heavy metal Pt.

In an eighteenth example, alone or in combination with one or more of the first through seventeenth example, the capping layer is formed to include a heavy metal Ta.

In a nineteenth example, alone or in combination with one or more of the first through eighteenth example, the capping layer is formed to include a fixed ferromagnetic material CoFe.

Although FIG. 3 shows example blocks of process 300, in some examples, process 300 may include additional blocks, fewer blocks, different blocks, or differently arranged blocks than those depicted in FIG. 3. Additionally, or alternatively, two or more of the blocks of process 300 may be performed in parallel.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. An antiferromagnetic tunnel junction (ATJ) device, comprising:
   a circular AFM layer, the AFM layer comprising an AFM material having at least two coupled magnetic sub-lattices;
   a circular tunnel barrier layer disposed on top of and interfaced with the AFM layer, the tunnel barrier layer comprising a metal oxide material; and
   a circular capping layer disposed on top of and interfaced with the tunnel barrier layer, the capping layer comprising a capping material selected from the group consisting of a heavy metal and a ferromagnetic material;
   wherein the circular AFM layer, tunnel barrier layer, and capping layer are arranged in a pillar and electrically conductive to pass an electrical current through the pillar.

2. The ATJ device of claim 1, wherein the AFM layer comprises an AFM material selected from the group consisting of PtMn, PtMn$_3$, IrMn$_3$, SnMn$_3$, and Pd$_2$Mn.

3. The ATJ device of claim 1, wherein the capping layer comprises a heavy metal selected from the group consisting of Pt and Ta.

4. The ATJ device of claim 1, wherein the capping layer comprises a fixed ferromagnetic material of one of CoFe and CoFeB.

5. An antiferromagnetic (AFM) memory device, comprising:
   a heavy metal (HM) layer having a first electrical terminal at a first end and a second electrical terminal at a second end, the HM layer comprising a heavy metal and being electrically conductive to pass an electrical current between the first electrical terminal and the second electrical terminal;
   an AFM layer disposed on top of and interfaced with the HM layer, the AFM layer comprising an AFM material having at least two coupled magnetic sub-lattices;
   a tunnel barrier layer disposed on top of and interfaced with the AFM layer, the tunnel barrier layer comprising a metal oxide material;
   a capping layer disposed on top of and interfaced with the tunnel barrier layer, the capping layer comprising a capping material selected from the group consisting of a heavy metal and a ferromagnetic material; and
   an electrode disposed on top of and in electrical communication with the capping layer, the electrode comprising an electrically conductive material.

6. The AFM memory device of claim 5, wherein the AFM layer comprises an AFM material selected from the group consisting of PtMn, PtMn$_3$, IrMn$_3$, SnMn$_3$, and Pd$_2$Mn.

7. The AFM memory device of claim 5, wherein the capping layer comprises a heavy metal selected from the group consisting of Pt and Ta.

8. The AFM memory device of claim 5, wherein the capping layer comprises a fixed ferromagnetic material of one of CoFe and CoFeB.

9. The AFM memory device of claim 5, wherein the AFM layer, the tunnel barrier layer, the capping layer, and electrode are arranged in a circular pillar having a diameter of about or less than 50 nm.

10. The AFM memory device of claim 5, wherein the AFM layer has a thickness within a range between about 7 nm and 20 nm.

11. The AFM memory device of claim 5, further comprising a plurality of AFM memory devices and electronic circuitry coupled with the plurality of AFM memory devices and the AFM memory device of claim 5 and configured as a complementary metal oxide semiconductor (CMOS)-compatible magnetic random-access memory (MRAM).

12. A method of fabricating an antiferromagnetic (AFM) memory device, comprising:
   forming a heavy metal (HM) layer having a first electrical terminal at a first end and a second electrical terminal at a second end, the HM layer comprising a heavy metal and being electrically conductive to pass an electrical current between the first electrical terminal and the second electrical terminal;
   forming a plurality of layers in a perpendicularly rising sequence above the HM layer, the plurality of layers comprising an antiferromagnetic (AFM) layer including an AFM material and interfaced with the HM layer, a tunnel barrier layer including a metal oxide material and interfaced with the AFM layer, a capping layer including a capping material selected from the group consisting of a non-magnetic metal and a ferromagnetic material, and an electrode interfaced with the capping layer;

performing thermal annealing; and
patterning the plurality of layers into a circular pillar.

13. The method of claim 12, wherein the AFM layer is formed including an AFM material selected from the group consisting of PtMn, $PtMn_3$, $IrMn_3$, $SnMn_3$, and $Pd_2Mn$.

14. The method of claim 12, wherein the AFM layer is formed with a thickness within a range between about 7 nm and 20 nm.

15. The method of claim 12, wherein the circular pillar is patterned with a diameter within a range of about 30 nm to about 50 nm.

16. The method of claim 12, wherein the circular pillar is patterned with a diameter within a range of about 50 nm to about 70 nm.

17. The method of claim 12, wherein forming the plurality of layers comprises sputter depositing using physical vapor deposition.

18. The method of claim 12, wherein the circular pillar is patterned using electron beam lithography.

19. The method of claim 12, wherein the tunnel barrier layer is deposited by radio-frequency (RF) sputtering.

20. The method of claim 12, wherein layers comprising metallic compounds are deposited by DC sputtering.

* * * * *